United States Patent
Arsovski et al.

(10) Patent No.: US 9,859,006 B1
(45) Date of Patent: Jan. 2, 2018

(54) ALGORITHMIC N SEARCH/M WRITE TERNARY CONTENT ADDRESSABLE MEMORY (TCAM)

(71) Applicant: GLOBALFOUNDRIES INC., Grand Cayman (KY)

(72) Inventors: Igor Arsovski, Williston, VT (US); Michael T. Fragano, Essex Junction, VT (US); Robert Houle, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/185,956

(22) Filed: Jun. 17, 2016

(51) Int. Cl.
  *G11C 15/04* (2006.01)
  *G11C 15/00* (2006.01)
(52) U.S. Cl.
  CPC .................................. *G11C 15/00* (2013.01)
(58) Field of Classification Search
  CPC ............................. H04L 63/08; G06F 12/0864
  USPC ................................... 365/49, 189.07, 49.17
  See application file for complete search history.

(56) References Cited

U.S. PATENT DOCUMENTS

| | | | | |
|---|---|---|---|---|
| 6,169,685 B1 * | 1/2001 | Gandini | ................. | G11C 15/04 365/189.07 |
| 6,711,665 B1 * | 3/2004 | Akerib | ................. | G06F 15/8038 711/108 |
| 7,304,873 B1 * | 12/2007 | Gupta | ................. | G06F 11/1068 365/189.07 |
| 8,908,407 B1 * | 12/2014 | Haukness | ............ | G11C 15/046 365/49.1 |

OTHER PUBLICATIONS

Office Action dated Feb. 9, 2017 in related DE Application No. 102016220328.2, 3 pages.

* cited by examiner

*Primary Examiner* — Huan Hoang
*Assistant Examiner* — Minh Dinh
(74) *Attorney, Agent, or Firm* — Anthony Canale; Andrew M. Calderon; Roberts Mlotkowski Safran Cole & Calderon, P.C.

(57) ABSTRACT

The present disclosure relates to a content addressable memory (CAM), and more particularly, to an algorithmic ternary content addressable memory (TCAM) that instantiates multiple copies of X-Y TCAMs. The structure includes a content addressable memory (CAM) and an array which instantiates multiple replicated copies of the CAM in a row direction and a column direction of the array.

20 Claims, 6 Drawing Sheets

ALGORITHMIC N SEARCH/M WRITE TERNARY CONTENT ADDRESSABLE MEMORY (TCAM)

FIELD OF THE INVENTION

The present disclosure relates to a content addressable memory (CAM), and more particularly, to an algorithmic ternary content addressable memory (TCAM) that instantiates multiple copies of X-Y TCAM instances.

BACKGROUND

Content Addressable Memory (CAM) is a special type of computer memory used in high-speed searching operations. A CAM is designed such that the user supplies a data word and the CAM searches its entire memory to see whether that data word is stored in the CAM. If the data word is found, the CAM returns a list of one or more storage addresses where the word was found.

A CAM is designed to search its entire memory in a single operation, which makes a CAM faster than Random Access Memory (RAM) in most search operations. However, in a CAM, each individual memory bit in a parallel CAM must have its own associated comparison circuit to detect a match between the stored bit and the input bit. Further, match outputs from each cell in the data word must be combined to yield a complete data word match signal.

High performance caches require large and fully associative translation lookaside buffers (TLBs). In order to perform multiple N searches and M writes in a cycle in a high performance cache, one alternative is to create a multi-write-multi-search ternary CAM (TCAM) cell that would support the required performance. A TCAM allows three matching states, which include 1, 0, and "X" (i.e., don't care) for one or more bits in the stored data word. However, this approach requires dedicated TCAM cells, which is very costly in terms of hardware circuitry. Another alternative is to implement the TCAM using Bit-Stacked-Latches. However, the TCAM instances and multi-port options using the Bit-Stacked-Latches are area inefficient and limit performance.

SUMMARY

In an aspect of the disclosure, a structure includes a content addressable memory (CAM) and a matrix which is structured to instantiate multiple replicated copies of the CAM in a row direction and a column direction of the array.

In another aspect of the disclosure, a structure comprises a matrix of multiple replicated copies of a content addressable memory (CAM) structure comprising a plurality of write rows and search columns structured such that multiple operations are captured at a time allowing for a search command to be executed in the first cycle and a write operation to be executed in the second cycle.

In another aspect of the disclosure, a method comprises: executing multiple searches in parallel in replicated CAM instances, in a first cycle; and executing multiple writes or reads in parallel in the replicated CAM instances, in a second cycle.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to content addressable memories (CAM), and more particularly, to an algorithmic ternary content addressable memory (TCAM) that instantiates multiple copies of X-Y TCAM instances. In particular, the present disclosure uses an algorithmic TCAM that instantiates multiple copies of X-Y TCAM instances to achieve the required N-search and M-write per cycle TCAM operations. In a specific example, the present disclosure allows for execution of three searches and two writes per cycle. Advantageously, the present disclose provides an improved search performance of the searchable TCAM structure by replicating multiple copies of X-Y TCAM to achieve a N-search and M-write per cycle TCAM.

In embodiments of the present disclosure, a method can implement a fully coherent algorithmic multi-port CAM solution using multiple one-port CAM instances, where an M-write/N-search CAM is implemented using an array of 2*N by 2*M CAM instances. Further, in embodiments of the present disclosure, two operations, 2*M writes and 2*N searches, can be captured every second cycle. Also, each search operation is supplied to one of the 2*N search columns, and each write operation is supplied to one of the 2*M write rows.

In more specific embodiments of the present disclosure, two sets of operations can be captured at a time allowing for a search command to be executed in the first cycle and a write operation to be executed in the second cycle. Further, a comparison between the write operations can be performed to maintain coherency during the search execution. Then, after the search is executed, the write operation can be executed based on the results of the search operation. In embodiments, the processes herein can execute N searches and M writes, capture them in one cycle and prioritize all searches and prioritize the writes in subsequent writes.

In embodiments of the present disclosure, an X-Y TCAM instance can be addressed by increasing a number of cycles to write 1 for the X portion and 1 for the Y portion of the TCAM. Further, the CAM can capture 3*N number of operations with the CAM enlarged (i.e., grown) to have 3*N columns and 2*M rows. In these embodiments, two cycles can perform the write operation. Also, the array can comprises a matrix of 2*M write rows by 2*N search columns to capture 2*(N+M) operations at a time.

Figure 1:
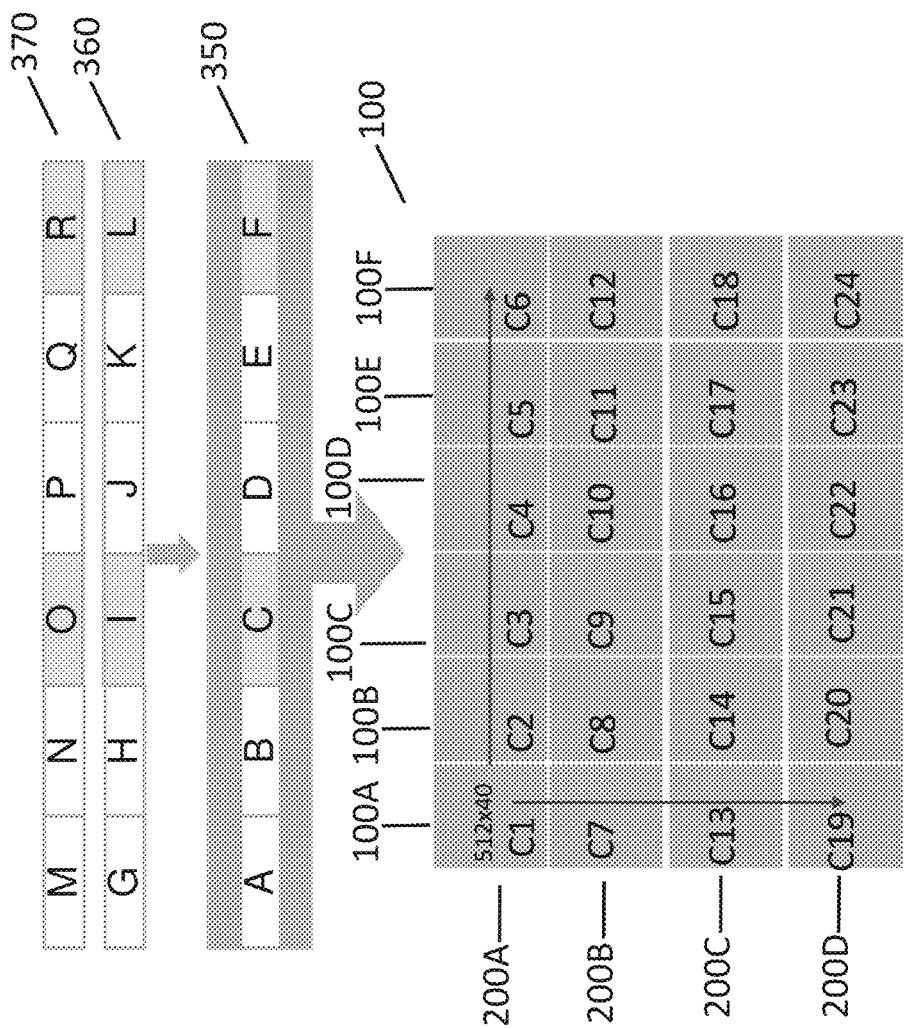
FIG. 1 shows a CAM structure in accordance with aspects of the present disclosure.

FIG. 1 shows a CAM structure in accordance with aspects of the present disclosure. In embodiments, the CAM structure 100 may be a Ternary CAM (TCAM) which comprises data search words comprising 1s, 0s, and "X" or "don't care", for one or more bits in the stored word. Alternatively, the CAM structure 100 of FIG. 1 may be a binary CAM which comprises data search words comprising entirely of 1s and 0s, for one or more bits in the stored word.

As shown in FIG. 1, the CAM structure 100 includes an array or matrix of replicated CAM instances C1-C24 (e.g., C1, C2, . . . Cn). In embodiments, the array or matrix of CAM instances C1-C24 can be a matrix of 2*N by 2*M, where N and M represent replicated instances of the CAM instance C1. More specifically, as shown in FIG. 1, the CAM structure 100 can include a plurality of columns 100A, 100B, 100C, 100D, 100E, and 100F and a plurality of rows 200A, 200B, 200C, and 200D, comprising replicated CAM instances represented by C2-C24. That is, the plurality of rows and columns are replicated CAM instances of the CAM instance C1. In embodiments, CAM instances C1-24 are physical hardware circuits. In embodiments, each CAM is 512 words×40 bits each, as an example.

Although, FIG. 1 shows a 4×6 matrix of 512×40 byte CAM instances, it should be understood that any matrix is contemplated by the present disclosure. The CAM structure 100 can be implemented as an N×M matrix of 512×40 value TCAM using 512×80 instances of X-Y TCAM, where a value TCAM requires one clock cycle to update a TCAM entry, and XY TCAM requires two clock cycles to update a TCAM entry. Also, although the CAM instance C1 is representative of a 512×40 byte CAM, embodiments of the present disclosure can include other CAM configurations, such as the a 512×80 byte CAM, a 512×160 byte CAM (i.e., 2 entry/match line implemented with a 4×3 matrix), or any other CAM configurations.

As shown in FIG. 1, a set of searches 350, 360, and 370 are illustrated. For example, search 350 includes six operations represented by "A", "B", "C", "D", "E", and "F". For the search 350, six operations are captured at a time. In embodiments of the present disclosure, "A", "B", "C", "D", "E", and "F" may comprise any combination of a data word or multiple data words. Further, each of the operations "A", "B", "C", "D", "E", and "F" can represent different combinations of a data word or multiple data words from the remaining operations.

In operation, as represented in FIG. 1, search 350 will search whether "A", "B", "C", "D", "E", and "F" are stored in the CAM structure 100. If the six operations (i.e., "A", "B", "C", "D", "E", and "F") are stored in the CAM structure 100, a hit will be returned and no write operation need be performed. Alternatively, if any of the six operations (i.e., "A", "B", "C", "D", "E", and "F") are not stored in the CAM structure 100, a miss will be returned, and a write operation will be performed as described herein. For example, the write operation can include writing "A", "B", "D", and "E", each of which would be duplicated across a respective row.

In embodiments, each of the words A, B, C, D, E, and F are independent in nature if A misses, but B, C, D, E, and F match, then A is the only one that will need to be updated. By way of another example, the processes disclosed herein can execute multiple searches in parallel in replicated CAM instances, in a first cycle, and execute multiple writes or reads in parallel in the replicated CAM instances, in a second cycle, independent of the search operations. Also, if the CAM write or search operations take multiple cycles, the CAM matrix can grow the rows or columns necessary to accommodate the parallelism.

Further, in embodiments, the write operations (e.g., "D", "E", "F") can be different from the search operations (e.g., "A", "B", "C"). In another example of the embodiments, the search operations can include "A", "B", "C", "D", "E", and "F", and the write operations can include "G", "H", "I", and "J". In other words, in the embodiments, there is no requirement to reuse the words of the search operations for write operations.

Figure 2:
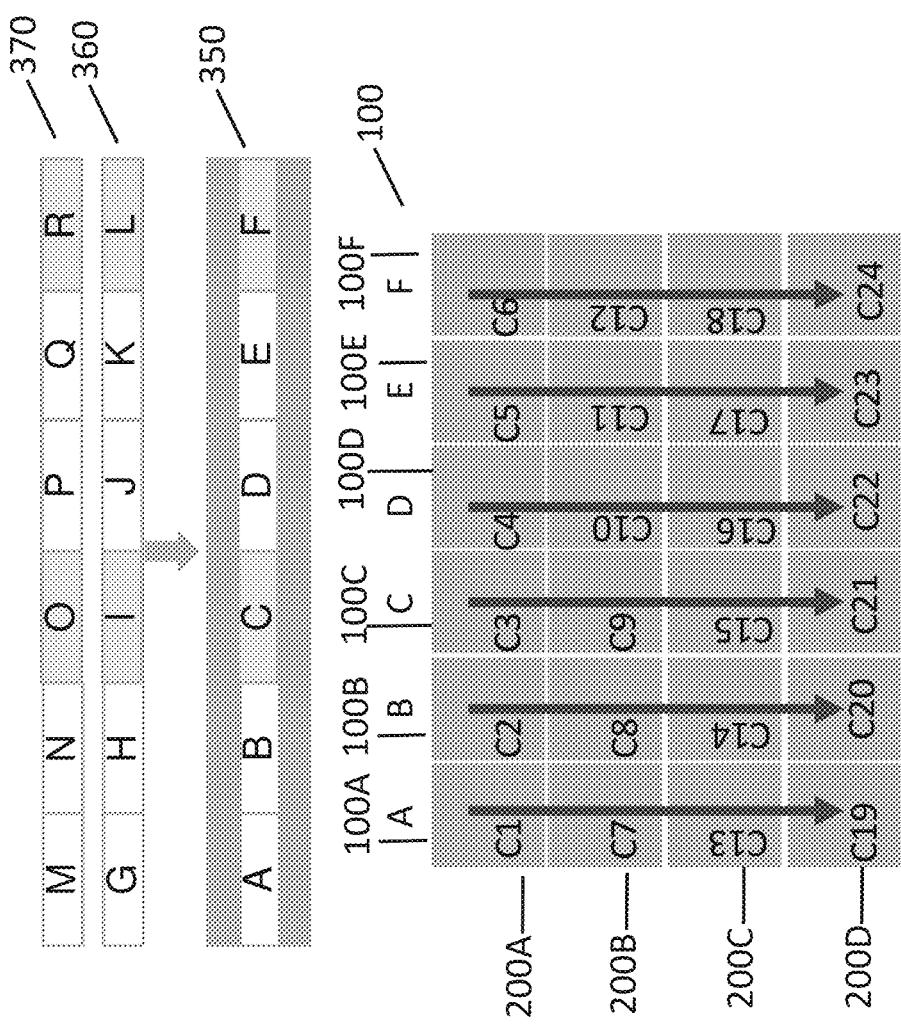
FIG. 2 shows a first cycle of executing a search operation using the CAM structure in accordance with aspects of the present disclosure.

FIG. 2 shows a first cycle of executing a search in the CAM structure in accordance with aspects of the present disclosure. In FIG. 2, the CAM structure 100 is searched using the search 350, e.g., each of the operations "A", "B", "C", "D", "E", and "F" by respective columns 100A-100F. For example, in the CAM structure, column 100A is searched using the operation "A", column 100B is searched using the operation "B", etc.

As shown representatively in FIG. 2, if one of the CAM instances of column 100A (e.g., C1, C7, C13, and C19) have data words which match the data words of operation "A" then the data words of operation "A" does not need to be written on the next cycle, if one of the CAM instances of column 100 B (e.g., C2, C8, C14, and C20) have data words which match the data words of operation "B" then the data words of operation "B" word does not need to be written on the next cycle, if one of the CAM instances of column 100C (e.g., C3, C9, C15, and C21) have data words which match the data words of operation "C" then the data words of operation "C" word does not need to be written on the next cycle, one of the CAM instances of column 100D (e.g., C4, C10, C16, and C22) have data words which match the data words of operation "D" then the data words of operation "D" word does not need to be written on the next cycle, one of the CAM instances of column 100E (e.g., C5, C11, C17, and C23) have data words which match the data words of operation "E" then the data words of operation "E" word does not need to be written on the next cycle, and one of the CAM instances of column 100F (e.g., C6, C12, C18, and C24) have data words which mach the data words of operation "F" then the data words of operation "F" word does not need to be written on the next cycle.

Therefore, if one of the CAM instances of column 100A have data words which match the data words of operation "A", one of the CAM instances of column 100B have data words which match the data words of operation "B", one of the CAM instances of column 100C have data words which match the data words of operation "C", one of the CAM instances of column 100D have data words which match the data words of operation "D", one of the CAM instances of column 100E have data words which match the data words of operation "E", or one of the CAM instances of column 100F have data words which match the data words of operation "F", then a hit is returned and a write operation of "A", "B", "D", and "E" need not be performed. On the other hand, if the data words of any of the operations "A", "B", "C", "D", "E", and "F" are not matched across any of the CAM instances in a respective column (i.e., one of column 100A does not contain "A", column 100B does not contain "B", column 100C does not contain "C", column 100D does not contain "D", column 100E does not contain "E", and column 100F does not contain "F"), then a miss is returned for the associated word, and a write operation for the respective words is initiated.

At the same time as the CAM structure 100 is being searched with operations "A", "B", "C", "D", "E", and "F", a comparison can be performed between the four operations (i.e., search keys) that were supposed to be sequentially written (e.g., "A", "B", "D", and "E"). Therefore, searching operations can be performed at the same time as a comparison between writing operations in order to maintain coherency. One of ordinary skill in the art would understand that all of these operations in FIG. 2 are performed during the first cycle. Also, one of ordinary skill in the art would understand that "A", "B", "C", "D", "E", and "F" are illustrative, non-limiting examples of a search, and that other operations (e.g., searches 360 and 370) can also be performed within the context of the present disclosure. Also, although "A", "B", "C", "D", "E", and "F" in search 350 have been described as operations, one of ordinary skill in the art would understand that each of "A", "B", "D", "E", and "F" can also be referred to as search keys.

Figure 3:
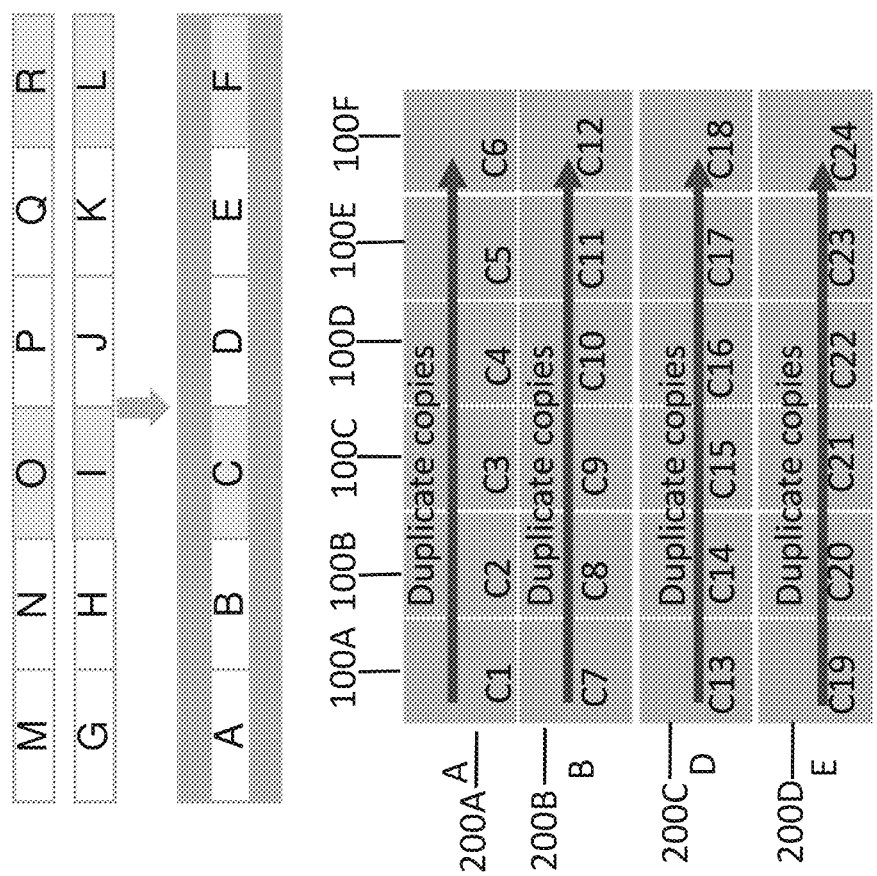
FIG. 3 shows a second cycle of executing a write operation using the CAM structure in accordance with aspects of the present disclosure.

FIG. 3 shows a second cycle of executing a write operation in the CAM structure in accordance with aspects of the present disclosure. In FIG. 3, embodiments of the present disclosure assume that the data words of operations "A", "B", "C", "D", "E", and "F" are not matched, a miss is returned, and write operations of "A", "B", "D", and "E" will be written. Specifically, and by way of illustrative, non-limiting example, in FIG. 3, the write operations of "A", "B", "D", and "E" will be written in respective rows 200A, 200B, 200C, and 200D comprising replicated CAM instances. For example, a data word of "A" operation and duplicate copies will be written in a row 200A. Further, a data word of "B" operation and duplicate copies will be written in row 200B. A data word of "D" operation and duplicate copies will be written in a row 200C, and a data word of "E" operation and duplicate copies will be written in a row 200D. Thus, each word would be duplicated across their respective row of N number of TCAMs. In this way, the write operations of "A", "B", "D", and "E" in FIG. 3 allow evaluation to occur in parallel in the next set of searching. Also, one of ordinary skill in the art would understand that the write operations can occur in different memory areas of the CAM structure 100 than memory areas which are searched.

Figure 4:
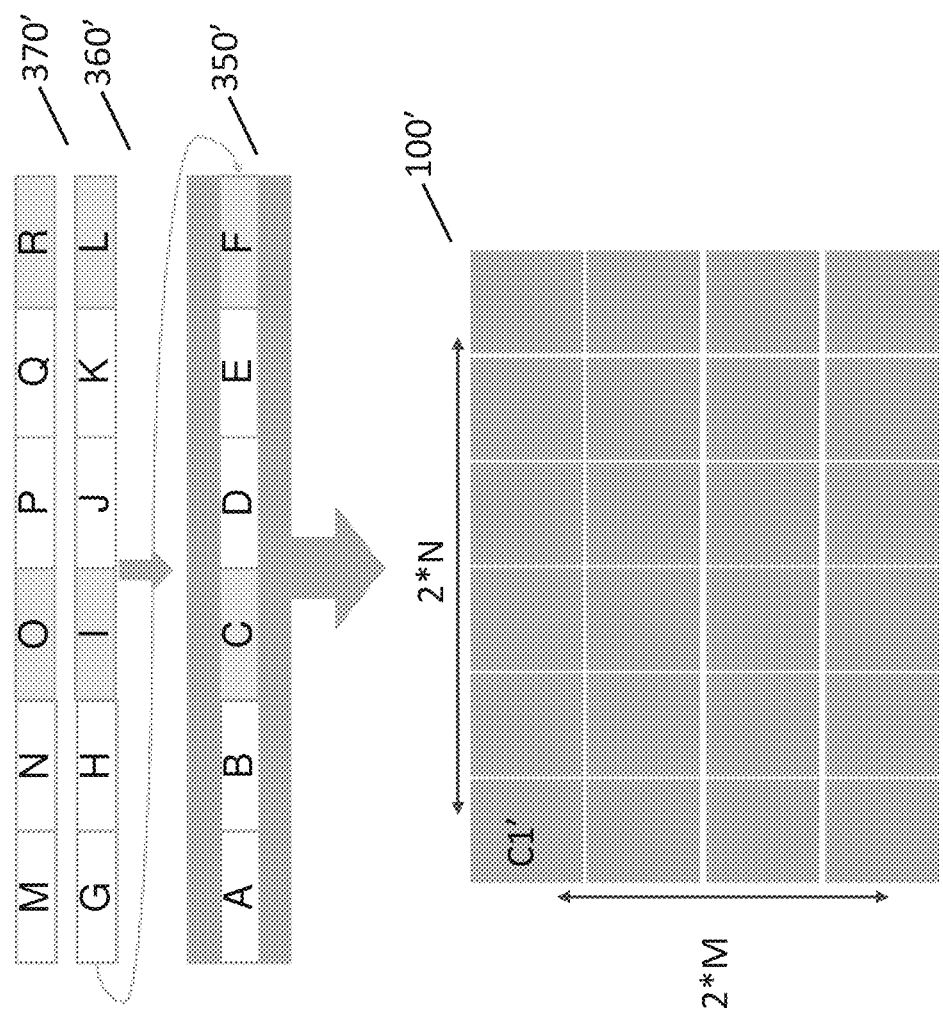
FIG. 4 shows a CAM structure in accordance with additional aspects of the present disclosure.

FIG. 4 shows a CAM structure in accordance with additional aspects of the present disclosure. In embodiments of the present disclosure, the CAM structure 100' of FIG. 4 may be a TCAM or, alternatively, a binary CAM. In any configuration, the CAM structure 100' comprises a CAM instance C1' which is replicated in the row and column directions. As shown in this configuration, the CAM instance C1' can be replicated in a 2*M×2*N matrix, where M and N can be any integer value. In embodiments, for example, N is an integer value greater than or equal to an integer value of M. However, in a more general embodiment, where the writes are not conditional on a hit or miss from the search, there need be no relationship between N and M, i.e., it is possible to have 100 searches and 2 writes, or 2 searches and 100 writes.

In embodiments shown representatively in FIG. 4, the CAM instance C1' is a 512×40 byte CAM; although other CAM configurations are contemplated herein. For example, the CAM instance C1' can be a 512×80 byte CAM, a 512×160 byte CAM (i.e., 2 entry/match line implemented with a 4×3 matrix), or any other configuration. In this way, multiple copies of the CAM instance C1' are instantiated in physical hardware circuitry in a 2*M×2*N matrix value CAM.

In the configuration of FIG. 4, the CAM structure 100' executes N searches and M writes every cycle on a, e.g., 512×40 bytes CAM. In FIG. 4, 2N operations are captured at a time. Searches 350', 360', and 370' can be variously modified to include 2N operations. For example, if three searches are required per cycle (i.e., N=3), then six operations would be performed (e.g., "A", "B", "C", "D", "E", and "F"). If any of the 2N operations are not stored in the CAM structure 100', then a miss is returned, and 2M operations are written. For example, if two writes are required per cycle (i.e., M=2), then four write operations would be performed (e.g., "A", "B", "D", and "E"). In FIG. 4, write operations and search operations are performed in a similar fashion as FIGS. 2 and 3.

Figure 5:
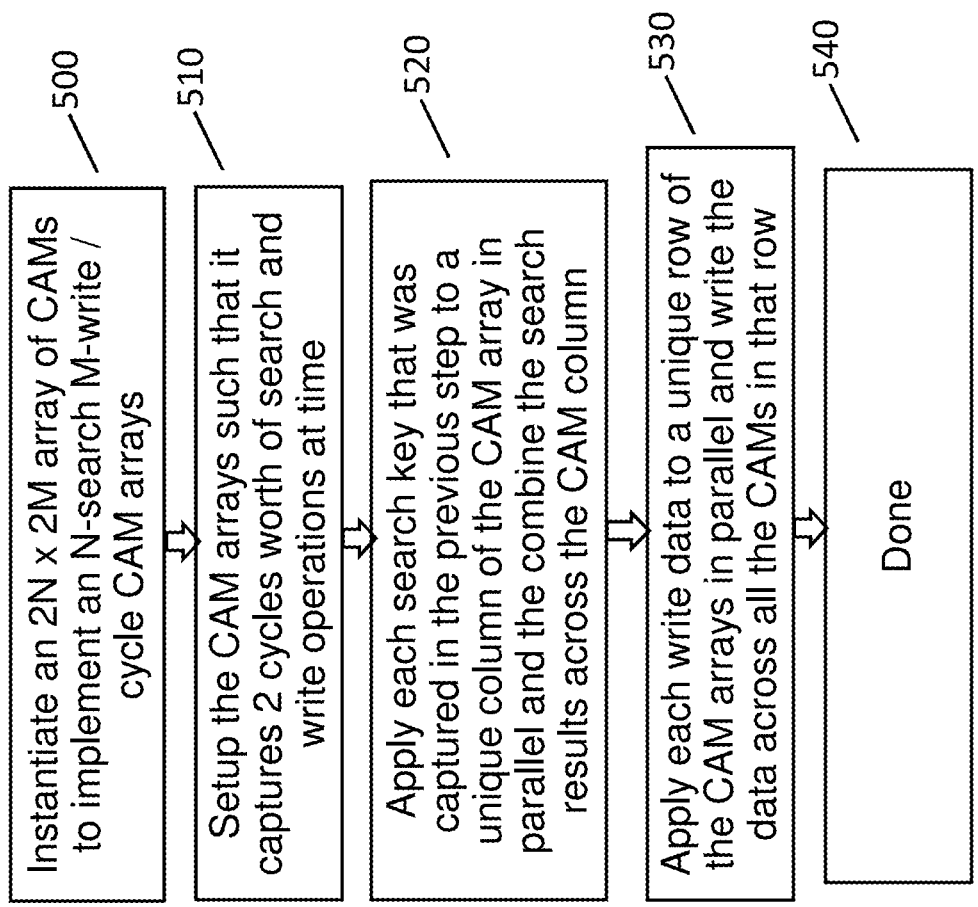
FIG. 5 shows a flowchart of steps using the CAM structure in accordance with aspects of the present disclosure.

FIG. 5 shows a flowchart of steps using the CAM structure in accordance with aspects of the present disclosure. As should be understood by one of ordinary skill in the art, aspects of the present disclosure are described herein with reference to flowchart illustrations which can be representative of diagrams of methods and apparatus (systems).

Referring to FIG. 5, at step 500, a 2*N×2*M array of CAMs are instantiated in physical hardware circuitry to implement an N-search/M-write per cycle CAM arrays. Then, at step 510, the CAM arrays are setup such that the CAM arrays capture two cycles worth of search and write operations at one time. At step 520, each search key that was captured in step 510 is applied to a unique column of the CAM array in parallel with step 510, and then the search results are combined across a CAM column. At step 530, each write is applied to a unique row of the CAM arrays in parallel and then the data is written across all the CAMs in that row. At step 540, the process is completed.

Figure 6:
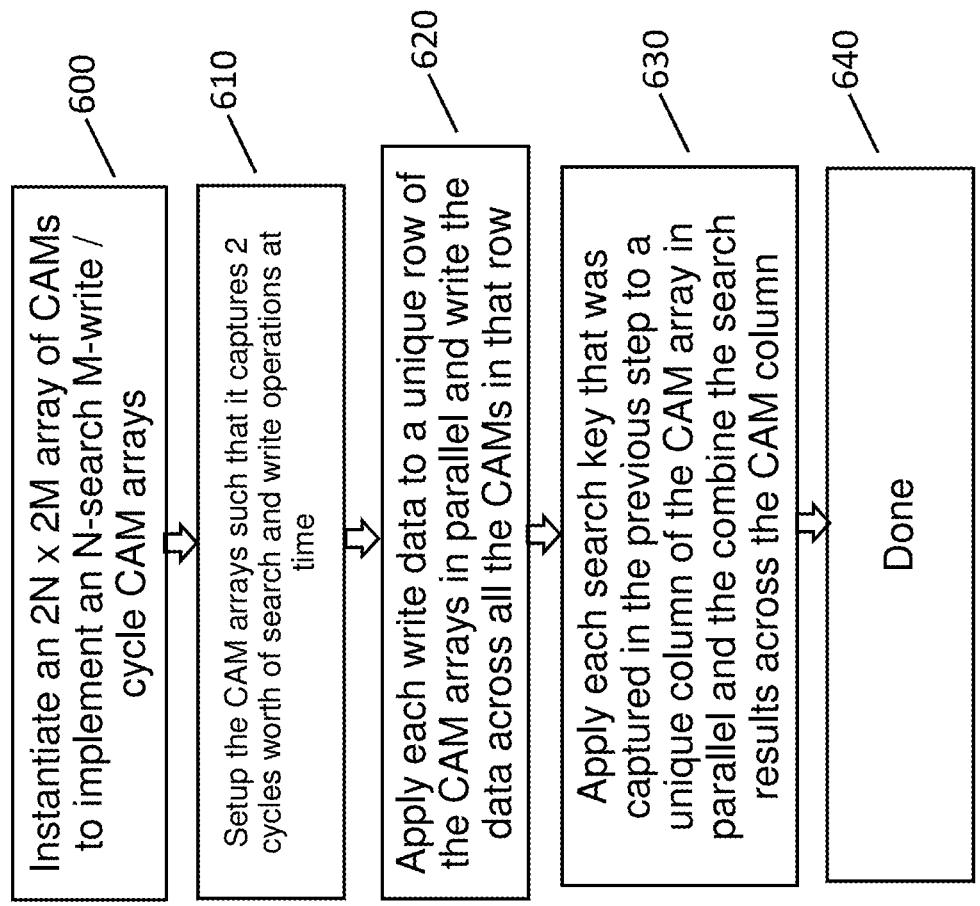
FIG. 6 shows another flowchart of steps using the CAM structure in accordance with aspects of the present disclosure.

FIG. 6 shows another flowchart of steps using the CAM structure in accordance with aspects of the present disclosure. As should be understood by one of ordinary skill in the art, aspects of the present disclosure are described herein with reference to flowchart illustrations which can be representative of diagrams of methods and apparatus (systems).

Referring to FIG. 6, at step 600, a 2*N×2*M array of CAMs are instantiated in physical hardware to implement an N-search/M-write per cycle CAM arrays. Then, at step 610, the CAM arrays are setup such that the CAM arrays capture two cycles worth of search and write operations at one time. At step 620, each write data can be applied to a unique row of the CAM arrays in parallel and then the data is written across all the CAMs in that row. At step 630, each search key that was captured in the step 610 is applied to a unique column of the CAM array, and then the search results are combined across a CAM column. At step 640, the process is completed.

The searchable CAM structure of the present disclosure can be manufactured in a number of ways using a number of different tools. In general, though, the methodologies and tools are used to form structures with dimensions in the micrometer and nanometer scale. The methodologies, i.e., technologies, employed to manufacture the searchable CAM structure of the present disclosure have been adopted from integrated circuit (IC) technology. For example, the structures are built on wafers and are realized in films of material patterned by photolithographic processes on the top of a wafer. In particular, the fabrication of the searchable CAM structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising: a content addressable memory (CAM) instance of a plurality of CAM instances; and a matrix of the plurality of CAM instances which is structured to instantiate multiple replicated copies of the CAM in a row direction of the matrix across a row of the CAM instances and a column direction of the matrix across a column of the CAM instances, wherein each of the plurality of CAM instances is a physical hardware circuit, and the matrix is structured such that multiple operations are captured at a time allowing for a search command to be executed in a first cycle and a write operation to be executed in a second cycle.

2. The structure of claim 1, wherein the matrix comprises a matrix of 2*M write rows by 2*N search columns of replicated CAMs, where M and N are integer values.

3. The structure of claim 2, wherein the integer value of N is greater than the integer value of M.

4. The structure of claim 2, wherein the matrix is structured such that each of 2*N search operations are executed on a corresponding 2*N search column in the 2*M by 2*N matrix to search whether any search key of the 2*N search operations are stored in the matrix.

5. The structure of claim 2, wherein the matrix is structured such that each of 2*M write operations are executed on a corresponding row of 2*M rows in the 2*M by 2*N matrix.

6. The structure of claim 5, wherein the matrix is structured such that each of 2*M write operations are executed on the corresponding row of 2*M rows in the 2*M by 2*N matrix in response to at least one search key of a previous 2*N search operation.

7. The structure of claim 5, wherein the matrix is structured such that each of the 2*M write operations are replicated across the corresponding row of 2*M rows in the 2*M by 2*N matrix.

8. The structure of claim 4, wherein the matrix is structured such that each search operation is supplied to one of the 2*N search columns and each write operation is supplied to each of the 2*M write rows.

9. The structure of claim 1, wherein the matrix is structured such that two operations of 2*M writes and 2*N searches are captured every second cycle.

10. The structure of claim 1, wherein the CAM is one of a ternary CAM (TCAM) and a binary CAM.

11. A structure, comprising a matrix of multiple replicated copies of a content addressable memory (CAM) structure across a plurality of CAM instances in a plurality of write rows and across a plurality of CAM instances in a plurality of search columns structured such that multiple operations are captured at a time allowing for a search command to be executed in the first cycle and a write operation to be executed in the second cycle.

12. The structure of claim 11, wherein the matrix is structured to allow a comparison between multiple cycles worth of operations to maintain coherency.

13. The structure of claim 11, wherein the matrix is structured such that the write operation duplicates words across corresponding rows of the CAM structure.

14. The structure of claim 13, wherein the write operation is executed in the second cycle based on results of any of multiple search operations.

15. The structure of claim 11, wherein the matrix comprises a matrix of 2*M write rows by 2*N search columns to capture 2*(N+M) operations at a time.

16. The structure of claim 11, wherein the CAM is one of a ternary CAM (TCAM) and a binary CAM.

17. A method comprising:
   executing multiple searches in parallel in replicated CAM instances across a row and a column of a CAM matrix, in a first cycle; and
   executing multiple writes or reads in parallel in the replicated CAM instances, in a second cycle,
   wherein each of the plurality of replicated CAM instances is a physical hardware circuit.

18. The method of claim 17, wherein if the writes or searches take multiple cycles, the CAM matrix of the replicated CAM instances will grow rows or columns necessary to accommodate parallelism.

19. The method of claim 18, wherein the writing operations in each 2*M row occurs in at least the first cycle, and the searching in each column of the 2*N columns occurs in the second or greater cycle.

20. The method of claim 18, wherein:
   the executing of the multiple searches comprise searching for an operation in each column in the CAM matrix which comprises replicating copies of an instance of a CAM; and
   the executing of the multiple writes comprises writing a same entry in each replicated copy of the CAM in the row in response to the search operations being returned.

* * * * *